(12) United States Patent
Chen et al.

(10) Patent No.: US 11,069,740 B2
(45) Date of Patent: Jul. 20, 2021

(54) IMAGE SENSOR GRID AND METHOD OF MANUFACTURING SAME

(71) Applicant: TAIWAN SEMICONDUCTOR MANUFACTURING CO., Hsinchu (TW)

(72) Inventors: H. L. Chen, Hsinchu (TW); Huai-jen Tung, Tainan (TW); Keng-Ying Liao, Tainan (TW); Po-Zen Chen, Tainan (TW); Su-Yu Yeh, Tainan (TW); Chih Wei Sung, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 110 days.

(21) Appl. No.: 16/288,755

(22) Filed: Feb. 28, 2019

(65) Prior Publication Data
US 2020/0279887 A1    Sep. 3, 2020

(51) Int. Cl.
*H01L 27/146* (2006.01)

(52) U.S. Cl.
CPC .... *H01L 27/14685* (2013.01); *H01L 27/1464* (2013.01); *H01L 27/14623* (2013.01)

(58) Field of Classification Search
CPC ......... H01L 27/14685; H01L 27/14623; H01L 27/1464; H01L 27/14643–14663; H01L 27/14645–14647; H01L 27/14649–14652; H01L 27/14654–14656; H01L 27/14658–14663; H01L 27/146–14893; H01L 27/14603–14616; H01L 27/14618; H01L 27/1462–14623; H01L 27/14625–14629; H01L 27/1463; H01L 27/14636; H01L 27/14–14893; H01L 31/02005; H01L 31/02024–0203
USPC ........................................................ 257/435
See application file for complete search history.

(56) References Cited

U.S. PATENT DOCUMENTS

| | | | |
|---|---|---|---|
| 8,610,229 B2 | 12/2013 | Hsu et al. | |
| 9,041,140 B2 | 5/2015 | JangJian et al. | |
| 2003/0013282 A1* | 1/2003 | Hsieh | H01L 29/7833 438/514 |
| 2009/0224343 A1* | 9/2009 | Akram | H01L 27/14636 257/432 |
| 2009/0256225 A1* | 10/2009 | Nakai | H01L 27/14632 257/432 |
| 2013/0241018 A1* | 9/2013 | JangJian | H01L 27/14621 257/432 |
| 2015/0054103 A1* | 2/2015 | Mackey | H01L 27/14621 257/432 |

(Continued)

*Primary Examiner* — Calvin Y Choi
(74) *Attorney, Agent, or Firm* — Finnegan, Henderson, Farabow, Garrett & Dunner L.L.P.

(57) ABSTRACT

In a method for forming a semiconductor device photo-sensing regions are formed over a frontside of a substrate. A first layer is formed over a backside of the substrate and is patterned to form a plurality of grid lines. The grid lines can define a plurality of first areas and a plurality of second areas. A second layer maybe formed over exposed portions of the backside, the gridlines, the first areas, and the second areas and a third layer may be formed over the second layer. The second and third layer may have different etch rates and the third layer is pattern so as to remove the third layer from over the plurality of first areas.

20 Claims, 16 Drawing Sheets

(56) References Cited

U.S. PATENT DOCUMENTS

2015/0279022 A1\* 10/2015 Shuster .................. G06T 7/593
                                                                              345/427
2016/0240568 A1\* 8/2016 Hung ................ H01L 27/14689

\* cited by examiner

IMAGE SENSOR GRID AND METHOD OF MANUFACTURING SAME

TECHNICAL FIELD

The disclosure relates to semiconductor devices and methods for manufacturing semiconductor devices. More particularly, the disclosure relates to a back-side image sensor grid and a method for manufacturing the same.

BACKGROUND

Back-side illuminated (BSI) sensors are semiconductor devices capable of efficiently capturing photons and generating a corresponding electrical signal. BSI sensors are used for consumer electronics, among other applications, and are replacing traditional front-side illumination sensors because they have a higher efficiency, offer higher resolution, and may reduce fabrication costs. To form BSI sensors, photo-detecting devices, such as photo diodes, are formed on a substrate along with logic circuits and interconnect structures. The back of the substrate is processed to expose photo-detecting devices to potential light sources through the back-side of the substrate.

BSI sensors may generate electrical signals in response to the stimulation of photons that reach the detecting devices through the back-side. The magnitudes of the electrical signals (e.g., current signals) depend on the intensity of the incident light received by the respective photo-detecting devices. BSI sensors may be fabricated as matrices of photo-detecting devices. The signal outputs of these sensors may be aggregated to generate digital, pixelated images.

To reduce optical cross-talk between sensors and/or to improve resolution of the sensors, the light received by different photo-detecting devices in a matrix may be passed through grids, normally formed of metal, designed to isolate the light and/or to filter certain frequencies. Accurate fabrication of the grid is desirable to minimize or prevent light loss and light reflections that may degrade the quantum efficiency of the BSI sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-7A show exemplary sequential manufacturing process steps for forming a semiconductor device in accordance with embodiments of the present disclosure.

FIGS. 12A-13A show exemplary sequential manufacturing process steps for forming a semiconductor device in accordance with embodiments of the present disclosure.

FIGS. 1B-13B show cross-sectional views corresponding to line X1-X2 of respective FIGS. 1A-13A.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1A-7A show exemplary sequential manufacturing process steps for forming a semiconductor device according to embodiments of the present disclosure. FIGS. 1B-7B provide diagrammatic cross section views corresponding to line X1-X2 of respective FIGS. 1A-7A. It is to be understood that relative to the processing operations represented in FIG. 1A-7A, additional operations can be provided before, during, or after processes represented in these figures. Additionally or alternatively, some of the operations described below can be replaced or eliminated in certain instances. Further, the order of the operations/processes may be interchangeable.

Figure 1B:
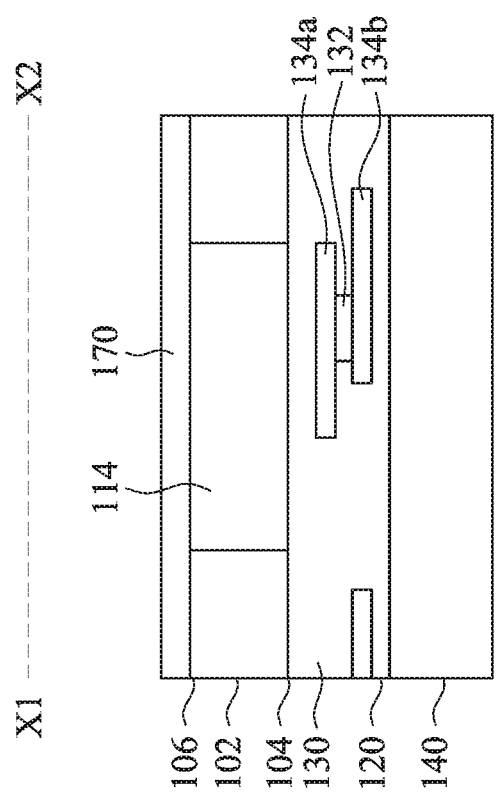
Figure 1A:
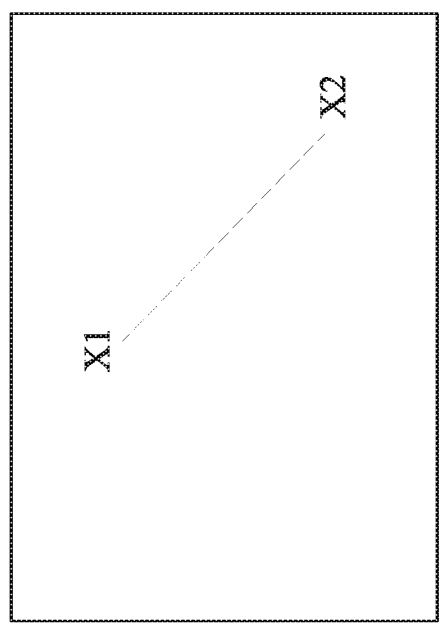

FIG. 1A shows a top view (plan view) of a back-side of a semiconductor device after completing front-side processing. In FIGS. 1A and 1B, the semiconductor device includes a substrate 102 having a front surface 104 and a backside 106. In the depicted embodiment, substrate 102 may be a semiconductor substrate including silicon. Alternatively, or additionally, substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlIn As, AlGaAs, GaInAs, GaInP, and/or GaInAsP; or combinations thereof. Substrate 102 may be a semiconductor on insulator (SOI). Substrate 102 may include a doped epi layer, a gradient semiconductor layer, and/or a semiconductor layer overlying another semiconductor layer of a different type, such as a silicon layer on a silicon germanium layer.

Substrate 102 may be a p-type or an n-type substrate depending on design requirements of the integrated circuit device 100. For example, substrate 102 may be a p-type substrate including P-type dopants such as boron, gallium, indium, other suitable p-type dopants, or combinations thereof. In other embodiments, substrate 102 may include an n-type doped substrate including N-type dopants such as phosphorus, arsenic, other suitable n-type dopants, or combinations thereof. Alternatively, or additionally, substrate 102 may include various p-type doped regions and/or n-type doped regions. Doping may be implemented using a process such as ion implantation or diffusion in various steps and techniques.

Substrate 102 may include isolation features (not illustrated), such as local oxidation of silicon (LOCOS) and/or shallow trench isolation (STI), to separate (or isolate) various regions and/or devices formed on or within substrate 102. For example, the isolation features may separate a plurality of sensing regions 114 from one another. The isolation features may include silicon oxide, silicon nitride, silicon oxynitride, other suitable materials, or combinations thereof. The isolation features may be formed by any suitable process. For example, forming an STI includes a photolithography process, etching a trench in the substrate (for example, by using a dry etching and/or wet etching), and filling the trench (for example, by using a chemical vapor deposition process) with dielectric material. The filled trench may have a multi-layer structure, such as a thermal oxide liner layer filled with silicon nitride or silicon oxide.

The semiconductor device shown in FIGS. 1A and 1B includes a plurality a sensing regions 114 (also referred to as pixels). The sensing regions 114 detect an intensity (brightness) of radiation directed toward backside 106 of substrate 102. In some embodiments, sensing regions 114 may be configured to detect visible light. Alternatively, sensing regions 114 may be configured to detect infrared (IR), ultraviolet (UV), X-ray, microwave, other radiation types, or combinations thereof. Moreover, in certain embodiments, sensing regions 114 may be configured to exhibit sensitivity to particular light wavelengths, such as red (R), green (G), or blue (B) wavelengths. In such cases, sensing regions 114 may be configured to detect an intensity (brightness) of light having a particular wavelength. Individual sensing regions 114 may be arranged as pixels in a pixel array.

In some embodiments, sensing regions 114 may include photodetectors, such as photodiodes, that include a light sensing region (or photo-sensing region), which detect intensity (brightness) of different wavelengths. For example, sensing regions 114 may include photo-detecting devices to detect red, green, and/or blue light wavelengths. In such embodiments, sensing regions 114 may include doped regions having n-type and/or p-type dopants formed in substrate 102, for example along the front surface 104 of the substrate 102. The sensing regions 114 may be an n-type doped region and may be formed by various techniques, such as diffusion and/or ion implantation. The sensing regions 114 may further include one or more pinned layers. For example, sensing regions 114 may include a pinned layer disposed in the substrate at the front surface 104, a pinned layer disposed in the substrate at the backside 106, or both such that the sensing regions 114 are disposed between pinned layers disposed respectively at the front and back surfaces of the substrate. The pinned layers may include doped layers, which may be doped n-type or p-type depending on design requirements of the sensing regions 114. The pinned layers may be configured to prevent interface depletion (i.e., neutralize interface states) during photodetection and stabilize sensing regions 114 by providing additional charge. Pinned layers, therefore, may be configured to improve dark current, increase sensitivity, and enhance saturation of sensing regions 114. Sensing regions 114 may also include various transistors, such as a transfer transistor (not illustrated), a reset transistor (not illustrated), a source-follower transistor (not illustrated), a select transistor (not illustrated), other suitable transistors, or combinations thereof. Sensing regions 114 and various transistors (which can collectively be referred to as pixel circuitry) may be connected and configured to enable sensing regions 114 to detect intensity of the particular light wavelength and transmit an electrical response. Additional circuitry, input, and/or outputs may be provided to the sensing regions 114 to provide an operation environment for the sensing regions 114 and/or support communication with the sensing regions 114.

The semiconductor device may also include a multilayer interconnect (MLI) 120 disposed over front surface 104. As shown in FIG. 1B, MLI 120 may be disposed in contact with sensing regions 114. The MLI 120 may be coupled to various components of the semiconductor device, such as the sensing regions 114, and associated transistors, in order to operate sensing regions 114 and enable responses to incoming radiation. The MLI 120 includes various conductive features, which may include vertical interconnects, such as contacts and/or vias 132, and/or horizontal interconnects, such as lines 134. Vias 132 and lines 134 may include conductive materials, such as metal. For example, vias 132 and lines 134 may include aluminum, aluminum/copper alloy, titanium, titanium nitride, tungsten, polysilicon, metal silicide, or combinations thereof, may be used, and the various vias 132 and lines 134 may be referred to as interconnects. Interconnects may be formed by a process including physical vapor deposition (PVD), chemical vapor deposition (CVD), or combinations thereof. Other manufacturing techniques to form vias 132 and lines 134 may include photolithography processing and etching to pattern conductive materials to form the vertical and horizontal interconnects. Still other manufacturing processes may be implemented to form the MLI 120, such as a thermal annealing to form metal silicide. The metal silicide used in the multilayer interconnects may include nickel silicide, cobalt silicide, tungsten silicide, tantalum silicide, titanium silicide, platinum silicide, erbium silicide, palladium silicide, or combinations thereof. Alternatively, the various vias 132 and lines 134 may include copper multilayer interconnects, which may include copper, copper alloy, titanium, titanium nitride, tantalum, tantalum nitride, tungsten, polysilicon, metal silicide, or combinations thereof. The copper interconnects may be formed by processes including PVD, CVD, or combinations thereof. It is understood that the MLI 120 is not limited by the number, material, size, and/or dimension of the vias 132 and 134 depicted, and thus, the MLI 120 may include any number, material, size, and/or dimension of conductive features depending on design requirements of the semiconductor device.

Vias 132 and lines 134 of the MLI 120 may be disposed in an interlayer (or inter-level) dielectric (ILD) layer 130. The ILD 130 may include silicon dioxide, silicon nitride, silicon oxynitride, TEOS oxide, phosphosilicate glass (PSG), borophosphosilicate glass (BPSG), fluorinated silica glass (FSG), carbon doped silicon oxide, Xerogel, Aerogel, amorphous fluorinated carbon, Parylene, BCB (bis-benzocyclobutenes), polyimide, other suitable materials, or combinations thereof. The ILD 130 may have a multilayer structure. The ILD 130 may be formed by a technique including spin-on coating, CVD, sputtering, or other suitable processes. In an example, the MLI 120 and ILD 130 may be formed in an integrated process including a damascene process, such as a dual damascene process or single damascene process.

A carrier wafer 140 may be disposed in contact with MLI 120 and over front surface 104. For example, carrier wafer 140 may be bonded to the MLI 120. In some embodiments, carrier wafer 140 may include silicon. Alternatively, carrier wafer 140 may include other suitable material, such as glass or silicon dioxide. Carrier wafer 140 can provide protection for the various features (such as the sensing regions 114) formed on the front surface 104 of the substrate 102, and can also provide mechanical strength and support for processing backside 106.

In some embodiments, the semiconductor device may include certain layers disposed over backside 106 of the substrate. For example, the semiconductor device may include an antireflective layer, which may include a dielectric material, such as silicon nitride or silicon oxynitride, and a dielectric layer 170. Dielectric layer 170 may be disposed over sensing regions 114. In some embodiments, intervening layers may be provided between dielectric layer 170 and sensing regions 114. For example, antireflective layers may be formed between dielectric layer 170 and sensing regions 114.

Dielectric layer 170 may have a thickness (i.e., a height of the layer from the substrate) of about 200 Å to about 5000 Å. For example, dielectric layer 170 may have a thickness between 1000 Å and 2000 Å, of about 1300 Å. Further, in the depicted embodiment, dielectric layer 170 may be an oxide-containing layer. In some embodiments, dielectric layer 170 may be formed on the semiconductor device after completing front-side steps and bonding substrate 102 to carrier wafer 140. In other embodiments, dielectric layer 170 may include a buried oxide layer (BOX) of a silicon-on-insulator substrate. For example, when the handle layer of a silicon-on-insulator substrate is completely etched during backside 106 processing, the BOX of the substrate may form dielectric layer 170.

Figure 2B:
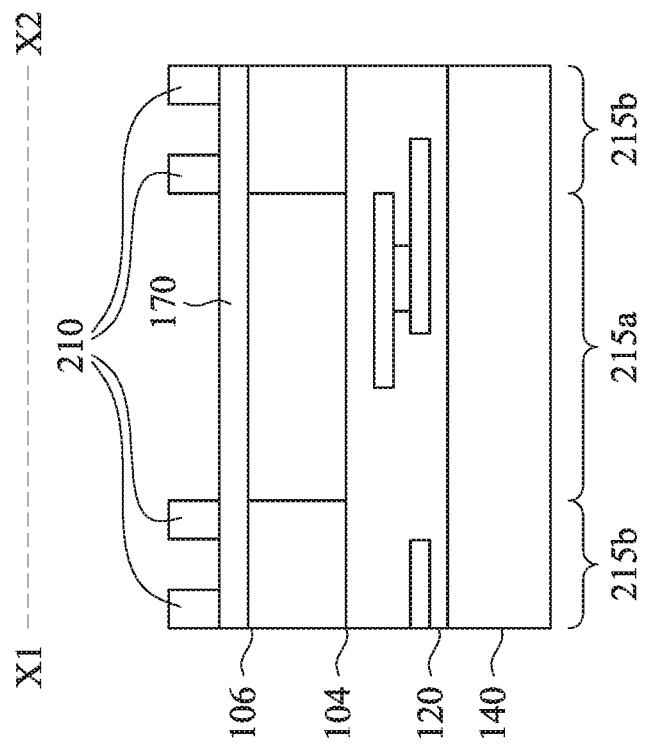
Figure 2A:
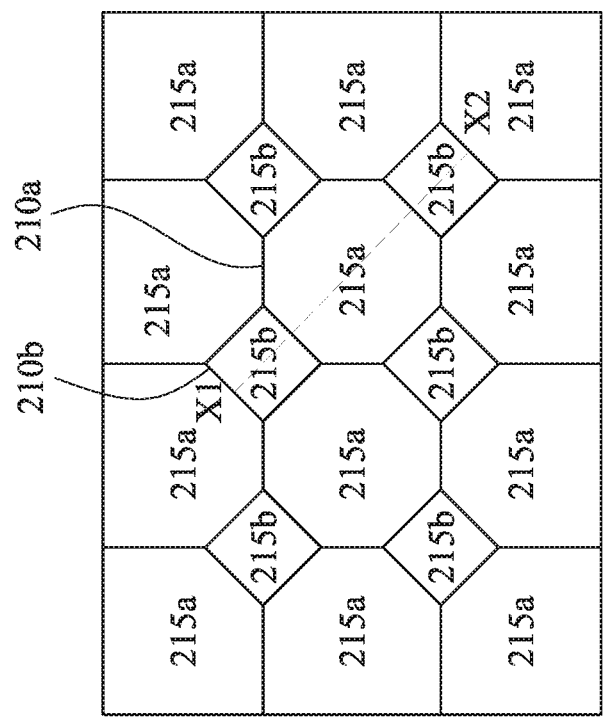

As shown in FIGS. 2A and 2B, after forming or exposing dielectric layer 170, gridlines 210 may be formed over dielectric layer 170. Gridlines 210 may be formed by patterning a reflective layer that is deposited on dielectric layer 170. For example, a metal layer, such as tungsten, may be formed on dielectric layer 170 using any of CVD, PVD, ALD, electroplating or other suitable methods. A protective layer may be formed over the metal layer to cover regions of the conductive layer that form gridlines. The exposed regions of the metal layer, not protected by the protective layer, may be etched when exposed to an etchant forming gridlines 210. Alternatively, gridlines 210 may be formed with lift-off processes or other suitable methods to define gridlines 210.

The reflective layer used to form gridlines 210 may include metals such as tungsten, cobalt, titanium, aluminum, copper, and/or aluminum copper. Alternatively, or additionally, gridlines 210 may be formed with multiple layers of different materials. For example, gridlines 210 may be formed with a plurality of layers including titanium, titanium nitride, tantalum, tantalum nitride, aluminum, tungsten, copper, copper alloy, alloys thereof, or combinations thereof. Further, gridlines 210 may include other material layers, such as semiconductor layers and/or dielectric layers, depending on design requirements of the semiconductor device.

Gridlines 210 may have a thickness between 100 Å and 10000 Å. For example, gridlines 210 may have a thickness of about 1500 Å to about 2500 Å. Alternatively, in some embodiments, gridlines 210 may have a thickness between 1000 Å and 5000 Å. However, in other embodiments, gridlines 210 may have a thickness of about 400 Å to about 800 Å.

As shown in FIG. 2A gridlines 210 may define a plurality of areas 215 (e.g., regions 215a and 215b) on dielectric layer 170. Areas 215 may be arranged in different periodic patterns according to a pixel matrix corresponding to sensing regions 114. Thus, as shown in FIG. 2A, areas 215 may be arranged in a matrix over dielectric layer 170. In some embodiments, gridlines 210 (e.g., gridlines 210a and 210b) may define two types of areas, including first areas 215a, which may overlap with corresponding sensing regions 114 formed on front surface 104, and second areas 215b, which may not overlap sensing regions 114. Indeed, as shown in FIG. 2B, first areas 215a may be substantially aligned with sensing regions 114 on front surface 104 while second areas 215b may not overlap any of the sensing regions 114.

In some embodiments, first areas 215a may be larger in surface area than the second areas 215b, and first areas 215a may be surrounded by a plurality of the second areas 215b. For example, as shown in FIG. 2A, each of second areas 215b may be bounded by at least four different first areas 215a. Further, as shown in FIG. 2A, areas 215 may be shaped as polygons having different shapes and/or numbers of sides. In some embodiments, first areas 215a may be defined by polygons having a greater number of sides than polygons defining second areas 215b. For example, while first areas 215a may be shaped as octagons, second areas 215b may be shaped as quadrilaterals. However, areas 215 in other embodiments may be defined by polygons other than octagons or quadrilaterals or may include combinations of shapes including octagons or quadrilaterals in combination with one or more other type of polygon. Additionally, any number of areas 215a and 215b may be configured with uniform shapes. Similarly, any number of areas 215a and 215b may exhibit non-uniform shapes. For example, in certain embodiments, both first areas 215a and second areas 215b may be defined with hexagons, pentagons, or polymers with irregular shapes.

In addition to differences in the shape and/or number of sides defining areas 215, areas 215 may vary in terms of size magnitude. For example, first areas 215a may be larger in area than second areas 215b. In some embodiments, each of first areas 215a may have an area that is greater than any of second areas 215b. Alternatively, or additionally, each of first areas 215a may be greater in area than the combined areas of four second areas 215b. For example, referring to FIG. 2A, a single region 215a may have an area that is less than the combined area occupied by four areas 215b, such as four regions 215b directly adjacent to a single region 215a.

In some embodiments, gridlines 210 defining areas 215 may all have the same width. However, in other embodiments, as shown in FIG. 2A, gridlines 210 may have varying widths. For example, the width of gridlines 210b, which define second areas 215b, may have a greater width than gridlines 210a, which delineate portions of areas 215a.

Figure 3B:
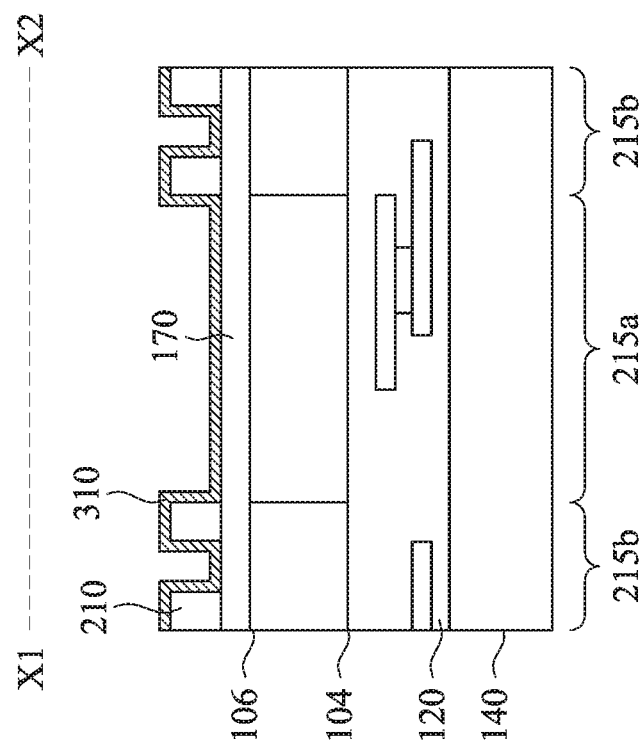
Figure 3A:
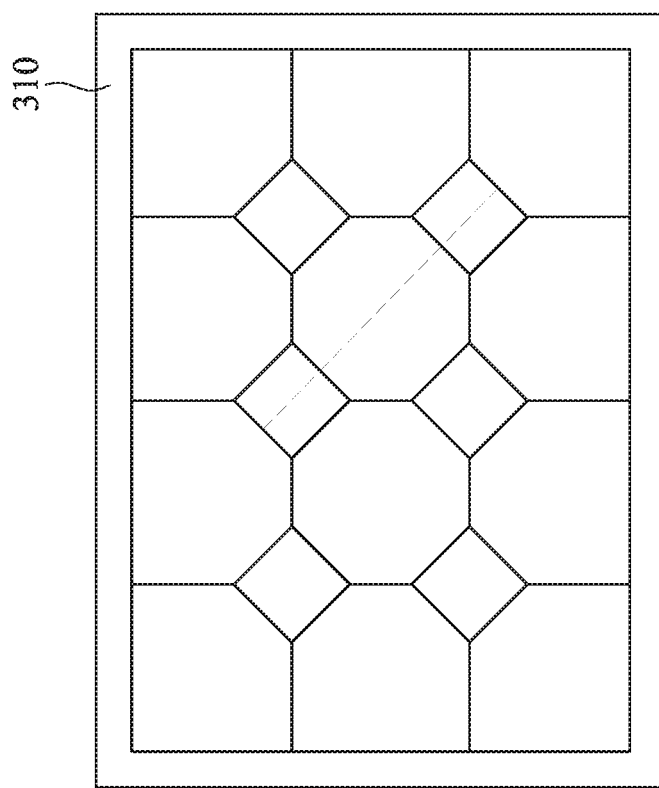

As shown in FIGS. 3A and 3B, after forming gridlines 210 (lines 210a and/or 210b), an etch-stop layer 310 may be formed on backside 106 of substrate 102 and over gridlines 210 and dielectric layer 170. Etch stop layer 310 may be deposited to conformally cover exposed regions of dielectric layer 170 and the formed gridlines 210. For example, etch-stop layer 310 may be formed using CVD methods that conformally deposit etch-stop layer 310, such as PECVD deposition, ALD, or other suitable methods to conformally deposit an insulating layer.

Etch-stop layer 310 may include one or more layers of insulating material such an oxide, carbide, nitrite, or oxynitride. The material used to form etch-stop layer 310 may be selected to have a high light transmission coefficient and a high etching selectivity. For example, etch-stop layer 310 may be formed with silicon dioxide to facilitate light transmission to sensing regions 114. Further, etch-stop layer 310 may have a thickness between 10 and 10000 Å or between 10 and 5000 Å. In other embodiments, etch-step layer 310 may have a thickness between 200 and 700 Å. Moreover, in some embodiments, etch-stop layer 310 may be selected based on the ratio of etch rates between etch-stop layer 310 and filter layer 410. That is, selection of etch-stop layer 310 may be based on the ability to selectively etch filter layer 410, while not etching etch-stop layer 310 (or not appreciably etching layer 310). Different etch rates for each material, or selective etch, may allow for over-etching of filter layer 410 with minimal to no damage to other layers of the semiconductor device.

Figure 4B:
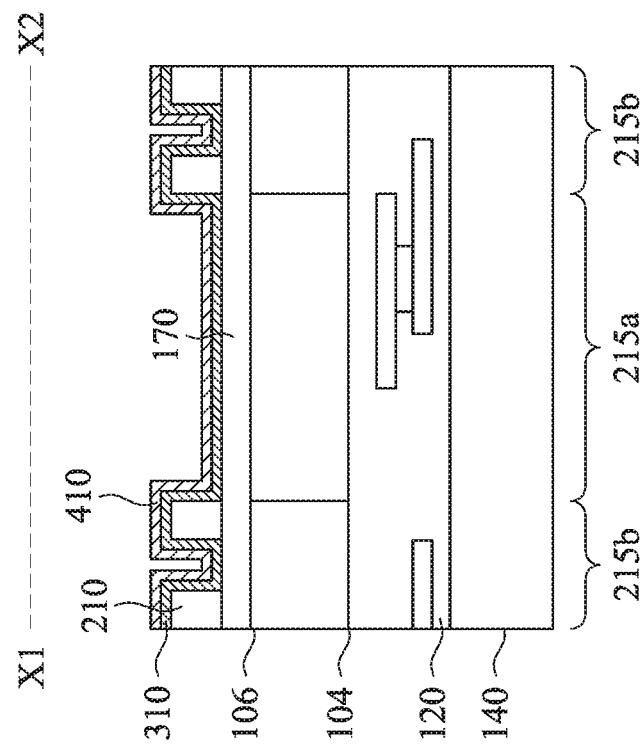
Figure 4A:
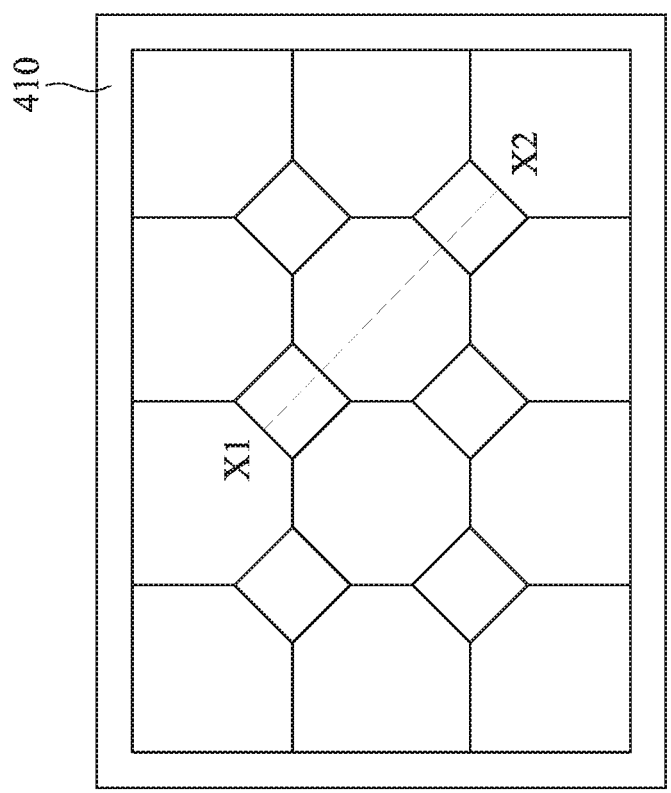

As shown in FIGS. 4A and 4B, a filter layer 410 may be formed over the etch-stop layer 310. Filter layer 410 may formed to provide LED flicker reduction (LFR) relative to the BSI sensors in order to improve the BSI performance. In some embodiments filter layer 410 may be conformally deposited, as described relative to FIG. 4B. For example, filter layer 410 may be formed by CVD, PVD, ALD, electroplating or other suitable methods that result in a conformal layer that covers top and side-walls of structures, like etch-stop layer 310.

Filter layer 410 may include a nitride layer or a metal layer. For example, filter layer 410 may include one or more layers of conductive material. such as Ti, TiAlC, Al, TiAl, TaN, TaAlC, TiN, TiC and Co. Alternatively, or additionally, filter layer 410 may be formed with one or more of TiN, TaN, TaAlC, TiC, TiAl, TaC, Co, Al, TiAl, HfTi, TiSi, TaSi or TiAlC. In one embodiment, TaAlC, TiAl or Al may be used to form filter layer 410. The thickness of the filter layer 410 may be in a range between 100 and 10000 Å. For example, in some embodiments, the filter layer may have a thickness between 700 and 1100 Å. The material and thickness used to form filter layer 410 may be selected so it does not fully block photon transmission, but instead allows transmission to occur while filtering certain ranges of wavelengths. For example, the material and thickness used for filter layer 410 may be selected such that filter layer 410 reduces or eliminates transmission of wavelengths between 10 and 10000 nm while allowing wavelengths outside this range. In other embodiments, the material and thickness of filter layer 410 may be selected so filter layer allows wavelengths between 10 and 10000 nm while reducing or eliminating transmission of wavelengths outside this range. In any of these embodiments, the material and thickness used for etch-stop layer 310, may be selected such that etch-stop layer 310 allows for greater transmission of wavelengths blocked or allowed by filter layer 410.

Figure 5B:
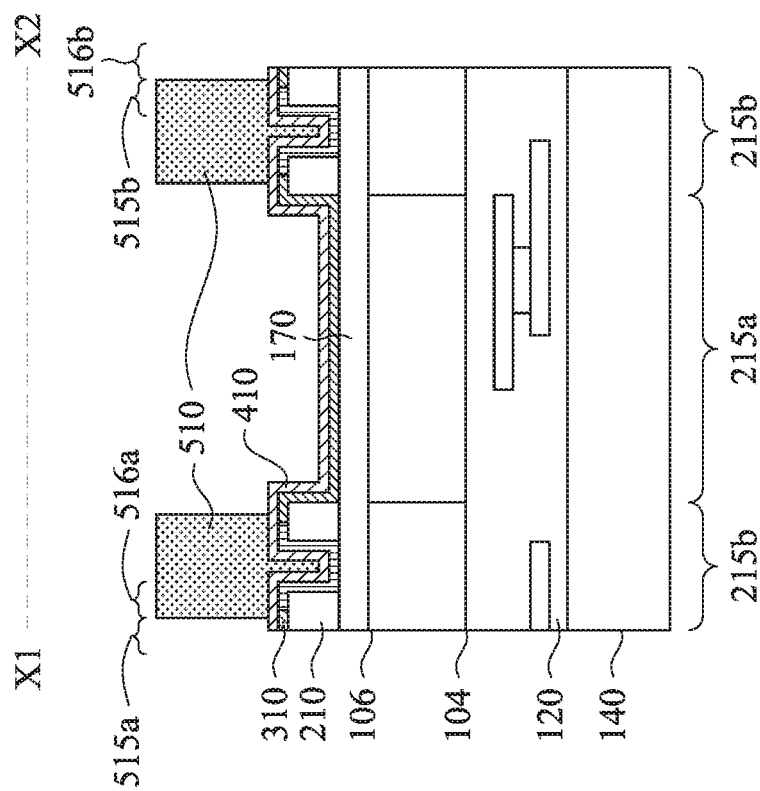
Figure 5A:
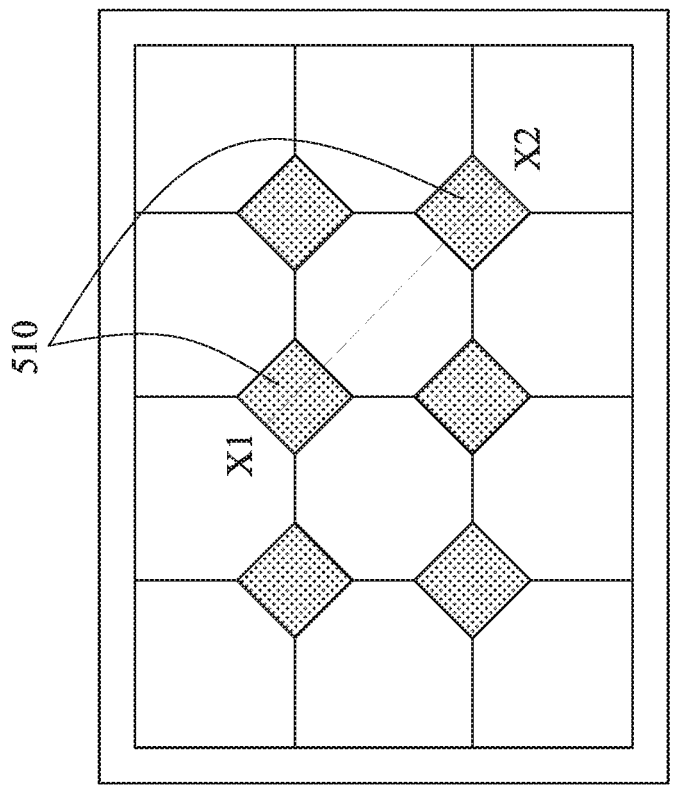

As shown in FIGS. 5A and 5B, a photoresist layer 510 may be formed in preparation to etching portions of filter layer 410. Positive or negative photoresist may be used for photoresist layer 510. In addition, different deposition methods may be used to form photoresist layer 510, including, but not limited to, spin-coating and roll-type coating. In some embodiments, the thickness of photoresist layer 510 may be associated with the thickness of the gridlines 210. For example, photoresist layer 510 may be formed to be at least twice the thickness of gridlines 210. For example, if gridlines 210 have a thickness of 2000 Å, photoresist layer 510 may be formed to be at least 4000 Å. In other cases, photoresist layer 510 thickness may have a thickness independent from the thickness of gridlines 210. For example, photoresist layer 510 may be formed to have a thickness anywhere between 3000 and 15000 Å. For example, photoresist layer 510 may have a thickness between 8000 and 12000 Å.

After the photoresist layer 510 is formed, it is patterned so it covers only second areas 215b. Patterning photoresist layer 510 may include performing photolithography and developing the photoresist to form openings in the photoresist. An exemplary patterning process includes soft baking of the photoresist layer, mask aligning, exposure, post-exposure baking, developing the photoresist layer 702, rinsing, and drying (e.g., hard baking). Alternatively, patterning photoresist layer 510 may include mask-less photolithography, such as electron-beam writing, and ion-beam writing.

Because radiation reaches sensing regions 114 through first areas 215a, it may be desirable to remove filter layer 410 from over the first areas 215a to encourage light transmission and improve the quantum efficiency. Accordingly, photoresist layer 510 may be patterned in preparation to etch filter layer 410 by removing the photoresist layer 510 from over first areas 215a. Moreover, photoresist layer 510 may also be patterned so it is completely removed from top surfaces of gridlines 210 and leave photoresist layer 510 only over second areas 215b. However, to reduce complexity of the photolithography process to pattern photoresist layer 510, the patterning of photoresist layer 510 may be performed so the photoresist layer 510 is removed from only a portion of the width of the plurality of gridlines 210. For example, photoresist layer 510 may be patterned so it is removed from at least half the width of gridlines 210. For example, photoresist layer 510 may be removed from the gridline outer portion 515 but be left covering gridline inner portion 516.

Figure 6B:
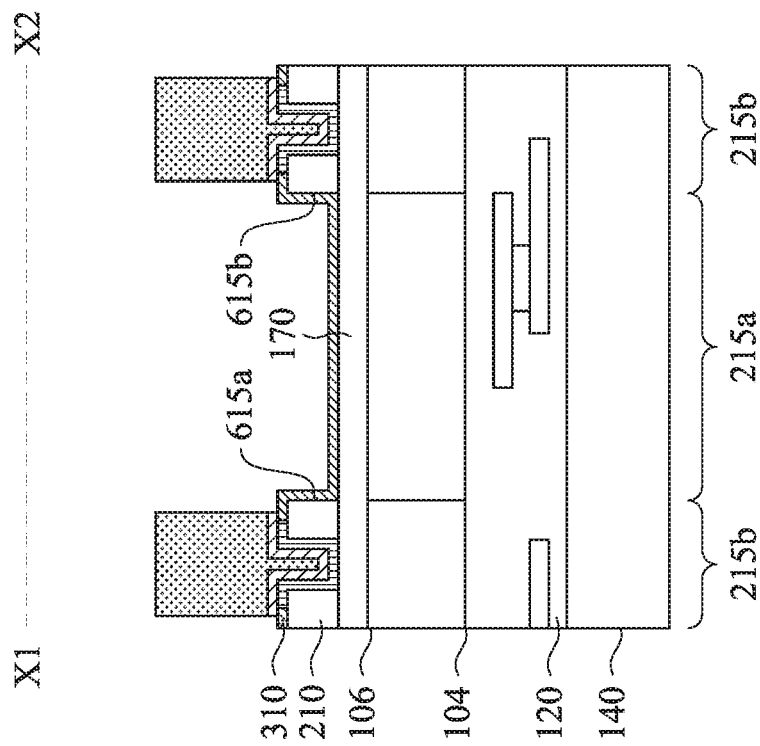
Figure 6A:
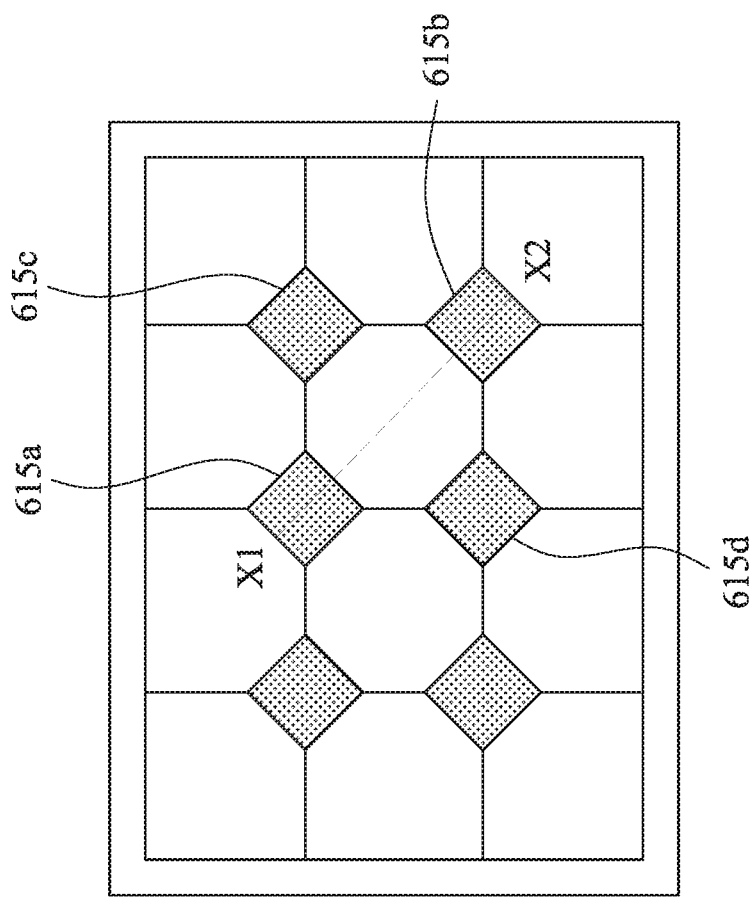

As shown in FIGS. 6A and 6B, the patterned photoresist layer 510 may be used as an etching mask that protects layers over second areas 215b but leaves exposed layers over first areas 215a during an etching process. That is, photoresist layer 510 opens first areas 215a for an etching process that may include dry etching, wet etching, and/or other etching methods.

Etching may be accomplished with an etchant that is selective to filter layer 410. For example, when filter layer 410 includes TiN, etching may be performed with a fluorine gas, such as SF6, CF4, CHF3 or C4F8 gases, that selectively etches TiN. Other etchants may also be selected in accordance to the material used for filter layer 410 and may include wet and/or dry etchants. Moreover, a combination of etchants or etching processes may be used to etch the exposed filter layer 410 on first areas 215a. For example, exposed filter layer 410 may be etched initially using a dry etch and be finalized using a wet etch. The etchant, or group of etchants, selected may have different etch rates for the layers formed in dielectric layer 170. For example, the selected etchant may etch filter layer 410 at a high etch rate while it may etch the etch-stop layer 310 at a low, or negligible, etch rate. In this way, the etching process to remove filter layer 410 from first areas 215a can have longer time tolerances, as it may allow for over-etching of filter layer 410.

When etch-stop layer 310 is not included in the BSI fabrication, removing filter layer 410 from first areas 215a may be time-sensitive and difficult to control. Lack of sufficient control may result in under-etching, which can lead to poor quantum efficiency because some of filter layer 410 may be left on first areas 215a, which subsequently can block the radiation directed to sensing regions 114. On the other hand, over-etching may also cause issues and degrade the device performance. For example, over-etching may result in unintended removal of other layers in the semiconductor chip that may be etched after filter layer 410 is removed. Such undesired etching may degrade the quality of the transmission layers, for example. Over-etching may also cause degradation of dielectric layer 170 and hinder the quantum efficiency of the sensing regions 114. Further, over-etching could also degrade gridlines 210 creating non-uniform gridlines that reduce the quantum efficiency by, for example, generating undesired reflections. However, using an etchant that etches filter layer 410 at a faster rate than etch-stop layer 310, allows exposure of filter layer 410 for a longer than necessary time while reducing over-etching the other layers. Accordingly, using an etchant with different etch rates for etch-stop layer 310 and filter layer 410 may facilitate some fabrication methods and enhance the reliability of the terminated device.

The selected etchant, or group of etchants, may etch filter layer 410 faster than it or they etch etch-stop layer 310. Moreover, the selected etchant may etch filter layer 410 faster than gridlines 210. For example, the selected etchant may etch filter layer 410 at a rate at least three times faster than the etch rate of the etch-stop layer 310. Further, the selected etchant may etch the gridlines at a rate at least twelve times faster than the etchant etches the etch-stop layer. In such embodiments, because gridlines 210 may etch significantly faster than filter layer 410, etch-stop 310 may protect gridlines 210 from over-etching during the etching process of filter layer 410. The previous etch ratios are exemplary, and different etch-rate relationships may be based on the selected etchant or group of etchants. Thus, the etch-rate relationships between filter layer 410, etch-stop layer 310, and gridlines 210 may be varied depending on the selected etching process.

As shown in FIG. 6B, the etching process removes filter layer 410 from first areas 215a. Additionally, as also shown in FIG. 6B, the etching process may partially remove some of the etch-stop layer 310 from over first areas 215a. Using etch-stop layer 310 allows over exposure of the semiconductor device to the selective etchant with less risk of damaging lower layers. However, etch-stop layer 310 may still be etched, although at a lower rate, when exposed to the etchant. Thus, first areas 215a may be covered by a thinner etch-stop layer 310 after the etching process. That is, some of the etch-stop layer 310 over first areas 215a is also etched away during the etching process. Similarly, in embodiments in which the top surface of gridlines 210 is not protected by photoresist layer 510, etch-stop layer 310 over exposed portions of gridlines 210 may be thinned by the etching process.

In some embodiments, after the etching process, corners 615 of first areas 215a may be covered by at least some remaining etch-stop layer 310. The directionality of some etching processes may result in lower etch-rates in the corners 615 of first areas 215a. Therefore, for some embodiments, the etch-stop layer may have a greater thickness closer to corners 615 than in the middle of first areas 215a.

Figure 7B:
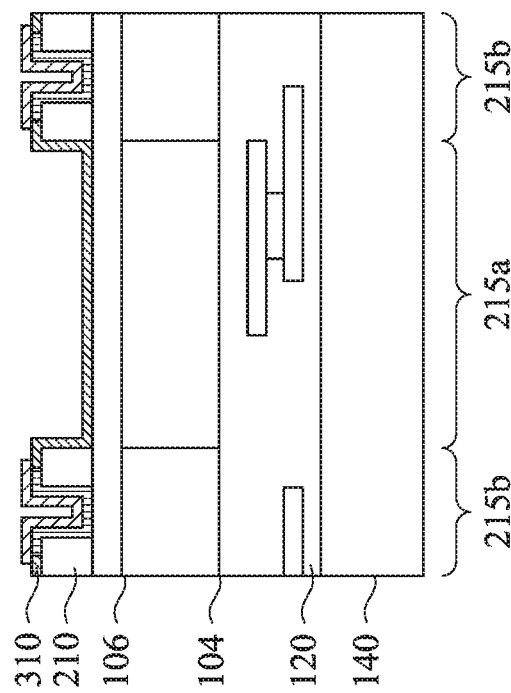
Figure 7A:
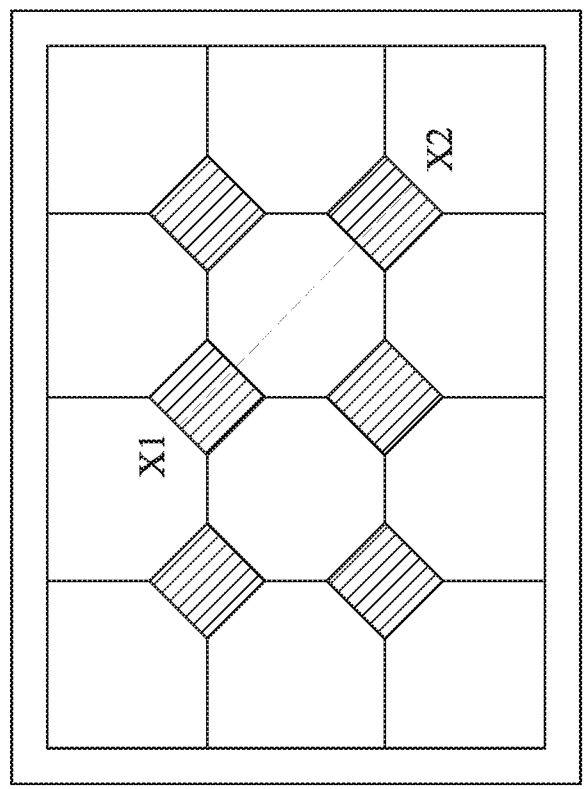
Figure 8B:
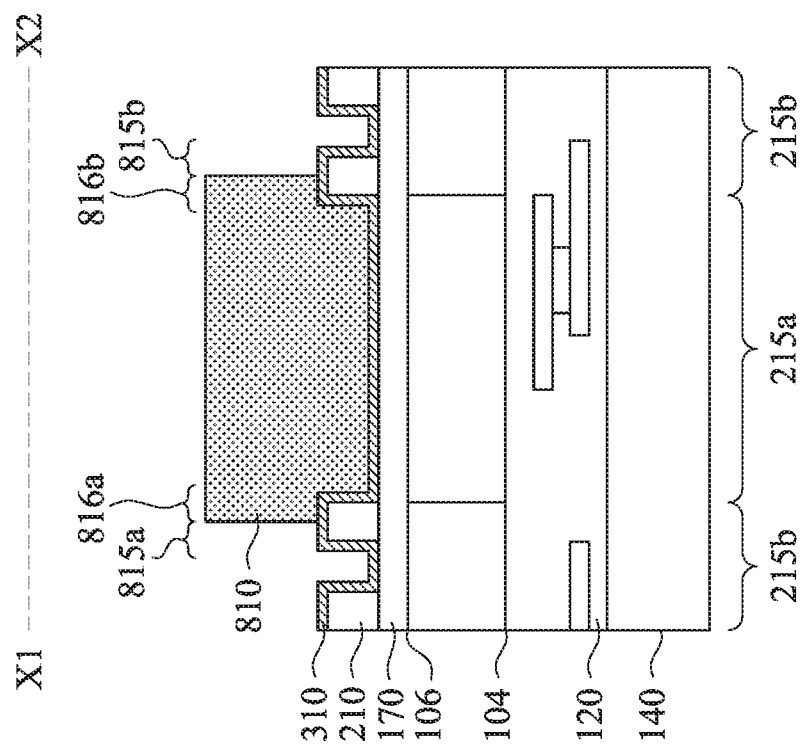
FIGS. 8A-11A show exemplary sequential manufacturing process steps for forming a semiconductor device in accordance with embodiments of the present disclosure.
Figure 8A:
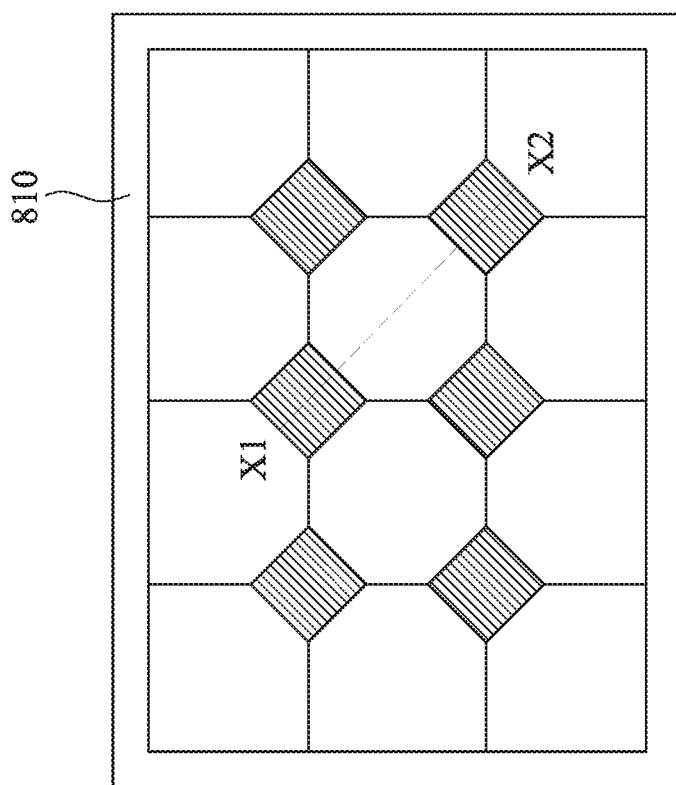

As shown in FIGS. 7A and 7B the remaining photoresist layer 510 over second areas 215b may be removed. For example, photoresist layer 510 may be exposed to an organic solvent that dissolves and removes remaining portions of photoresist layer 510 from the semiconductor device. Other methods such as dry etching of photoresist may also be used to remove remaining photoresist layer 510.

FIGS. 7A and 7B show the semiconductor device with a grid for the image sensors. The grid formed by gridlines 210 and filter layer 410 may prevent optical cross-talk between sensing regions 114 and enhance quantum efficiency. Moreover, the use of etch-stop 310 limits damage to other layers of the semiconductor device during the etching process of filter layer 410.

FIGS. 8-11 show exemplary sequential manufacturing process of a semiconductor device according to another embodiment of the present disclosure. FIGS. 8B-11B are cross sectional views corresponding to line X1-X2 of FIGS. 8A-11A. It is understood that additional operations can be provided before, during, and after processes shown by FIGS. 8-11, and some of the operations described below can be replaced or eliminated for additional embodiments of the method. The order of the operations/processes may be interchangeable. Further, The same of similar configuration, structure, materials, operations or processes of the foregoing embodiments may be employed in this embodiment and the detailed explanation may be omitted.

In this embodiment, filter layer 410 is deposited with a non-conformal deposition and it may be patterned with a lift-off process. In addition, in this embodiment etch-stop 310 is selectively removed after filter layer 410 is patterned.

After etch-stop layer 310 is formed, resulting in a semiconductor device similar to what is shown in FIG. 3, a lift-off layer 810 may be formed and patterned over etch-stop layer 310. Lift-off layer 810 may be a photoresist layer deposited with spin-coat process or other suitable methods. For example, lift-off layer 810 may be formed with a spin-coat of single layer photoresist. Alternatively, or additionally, lift-off layer 810 may be formed with multiple layers of photoresist with different etch patterns to create undercuts that facilitate lift-off of lift-off layer 810. For example lift-off layer 810 may be formed as a bilayer photoresist. While a bottom layer of the bilayer photoresists may have isotropic etching characteristics, a top layer of the bilayer photoresist may have anisotropic etching characteristics when exposed to the developer.

In some embodiments, the thickness of lift-off layer 810 may be associated with the thickness of the gridlines 210 or filter layer 410. For example, lift-off layer 810 may be formed to be at least twice the thickness of gridlines 210. If gridlines 210 have a thickness of 2000 Å, lift-of layer 810 may be formed to be at least 4000 Å. Alternatively, or additionally, lift-of layer 810 may be formed to be at least 10 times thicker than filter layer 410. For example, if filter layer 410 will be formed to have a thickness of 900 Å, lift-off layer 810 may be formed to have a thickness of at least 9000 Å. Nonetheless, lift-off layer 810 may have a thickness independent from the other layers. For example, in some embodiments, lift-of layer 810 may have a thickness between 3000 Å and 15000 Å. In such embodiments, lift-off layer 810 may have a thickness between 8000 Å and 12000 Å. Alternatively, when lift-off layer 810 is formed as a bilayer, a bottom layer may have a thickness between 3000 Å and 5000 Å, while the top layer may have a thickness between 5000 Å and 10000 Å.

After the lift-off layer 810 is formed, it is patterned so it covers only first areas 215a. In preparation to form filter layer 410 only over second areas 215b, lift-off layer 810 may be patterned to only cover first areas 215a. In this way, filter layer 410 will not be formed over first areas 215a. As previously disclosed in connection to FIG. 6, removing filter layer 410 from certain regions may enhance quantum efficiency of underlaying sensing regions 114. Moreover, lift-off layer 810 may also be patterned so it is removed from top surfaces of gridlines 210, leaving lift-off layer 810 only over first areas 215a. However, to reduce complexity of lift-off layer 810 photolithography, the patterning of lift-off layer 810 may be done to remove the layer only from a portion of the width of the plurality of gridlines 210. For example, lift-off layer 810 may be patterned so it is removed from a top surface portion 815 of gridlines 210 while still protecting a top surface portion of 816 of gridlines 210.

Figure 9B:
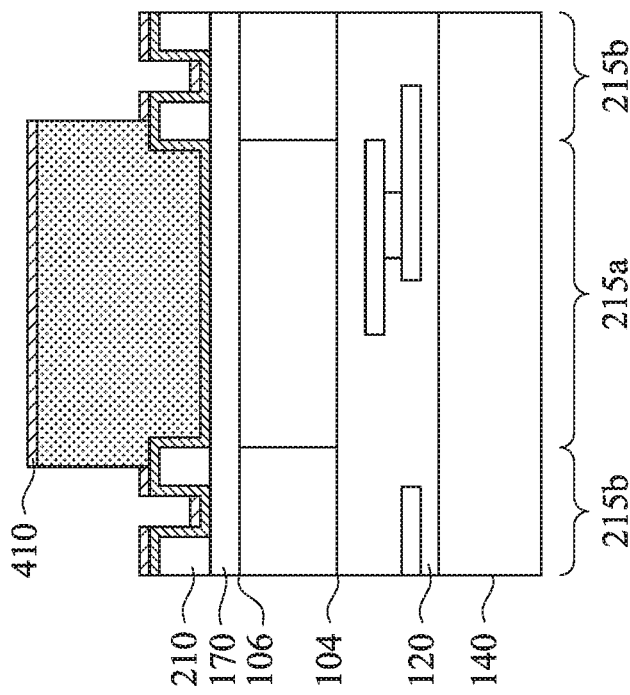
Figure 9A:
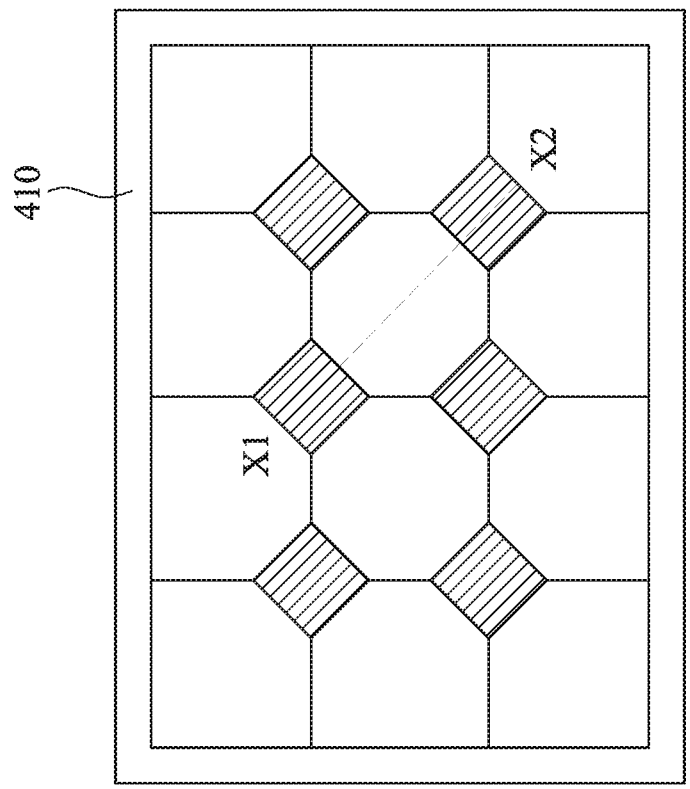

As shown in FIGS. 9A and 9B, once lift-off layer 810 is deposited and patterned on etch-stop layer 310, filter layer 410 may be formed over all exposed layers on the semiconductor device. In some embodiments, as shown in FIG. 9B, filter layer 410 may be formed with a non-conformal process and only top surfaces of the layers on the semiconductor device may be covered by filter layer 410. In other embodiments, however, filter layer 410 may be formed with a conformal process and both top surfaces and sidewalls of layers on the semiconductor device may be covered.

Figure 10B:
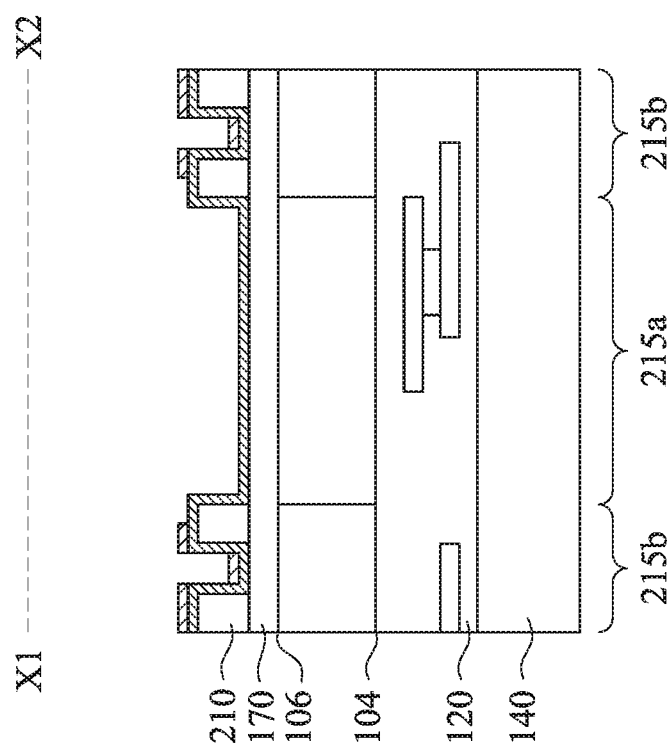
Figure 10A:
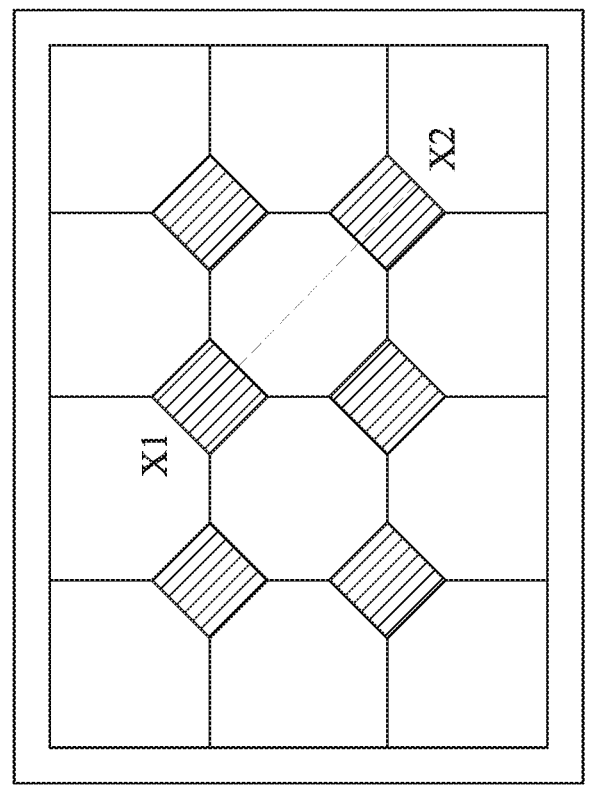

As shown in FIGS. 10A and 10B, lift-off layer 810 may be removed from the semiconductor device. Thus, filter layer 410 may be cleared from over areas 215 that are protected by the lift-off layer 810, but may be left over areas 215 not protected by the lift-off layer 810. In some embodiments, lift-off layer 810 may be removed using an etchant selective to lift-off layer 810. For example, when lift-off layer 810 is photoresist, a photoresist stripper may be used to remove lift-off layer 810. Removing lift-off layer 810 also removes filter layer 410 from areas 215 that were protected by the lift-off layer 810. Thus, in some embodiments, as shown in FIG. 10A, filter layer 410 may be only over second areas 215b after the lift-off process.

Figure 11B:
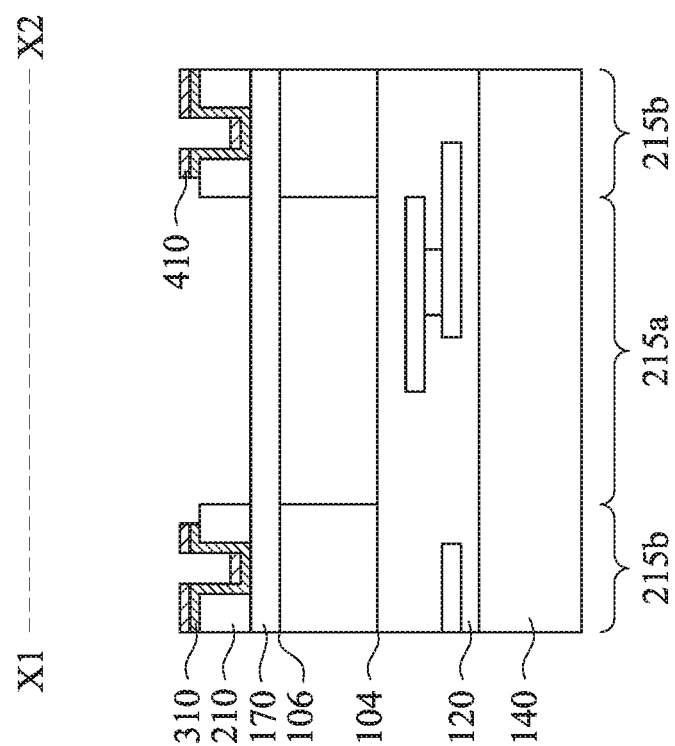
Figure 11A:
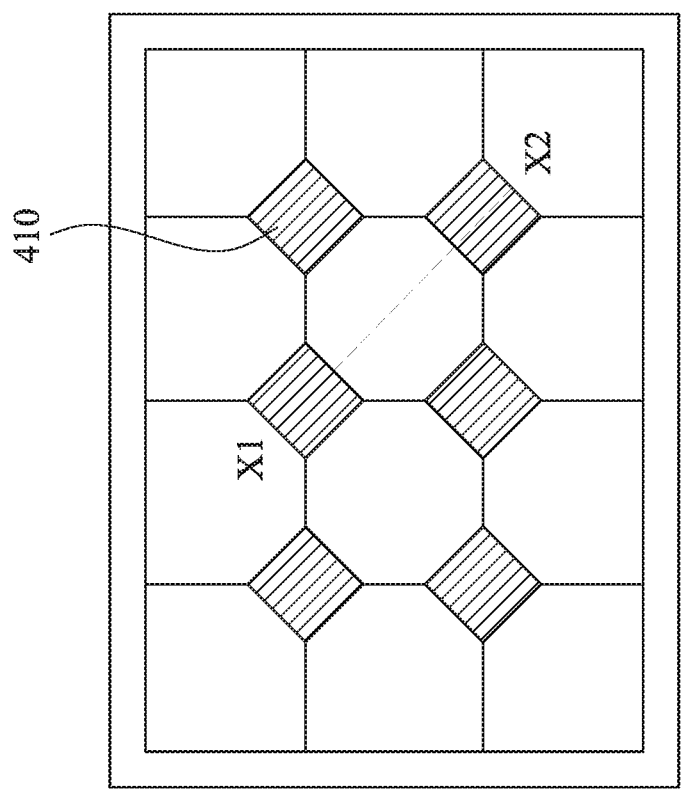

As shown in FIGS. 11A and 11B, after removing lift-off layer 810, etch-stop layer 310 may be selectively removed from first areas 215a. Thus, this embodiment may include removing etch-stop layer 310 from the plurality first areas 215a by etching exposed regions of etch-stop layer 310.

In some embodiments, it may be desirable to leave no etch-stop 310 covering first areas 215a to enhance the quantum efficiency of sensor elements 414. For example, if the thickness of etch-stop 310 may affect sensing regions 114 quantum efficiency, it may be desirable to remove it. In such embodiments, an etching process selective to etch-stop layer 310 may be performed to remove exposed etch-stop layer 310. An etchant for this process may be selected to quickly etch etch-stop layer 310 while minimally etching filter layer 410. For example, when filter layer 410 is a metallic layer and etch-stop layer 310 is a dielectric layer, the etchant selected for the etch in FIG. 11 may only remove dielectric materials and not etch metallic materials. Thus, filter layer 410 may act as a mask for an etchant that removes exposed etch-stop layer 310. Moreover, as shown in FIG. 11B, this etch process may be directional or anisotropic to minimize etching of sidewalls. For example, etching of etch-stop layer 310 may be performed with deep RIE to minimize sidewall etching.

Figure 12B:
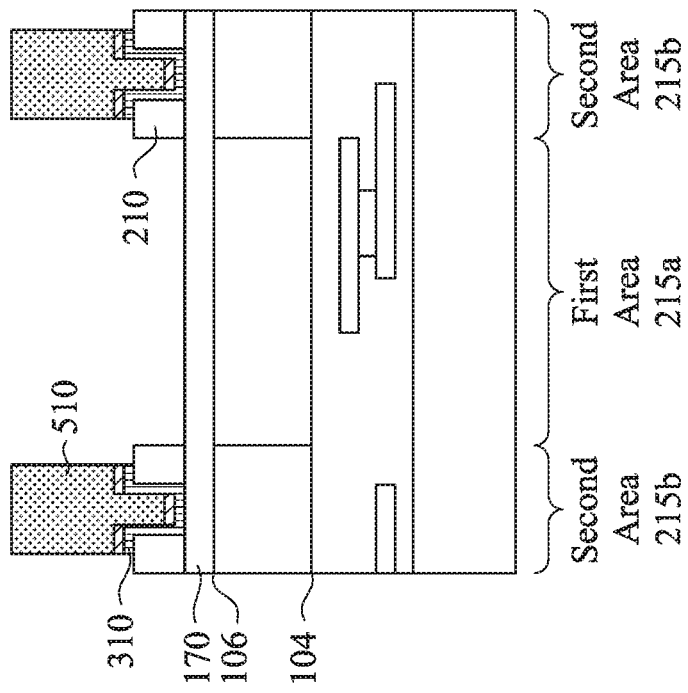
Figure 12A:
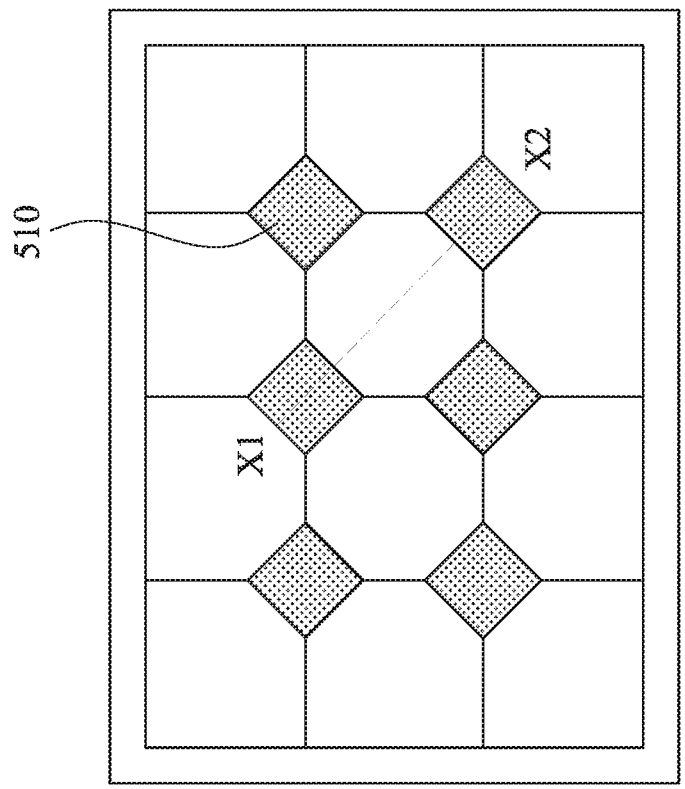
Figure 13B:
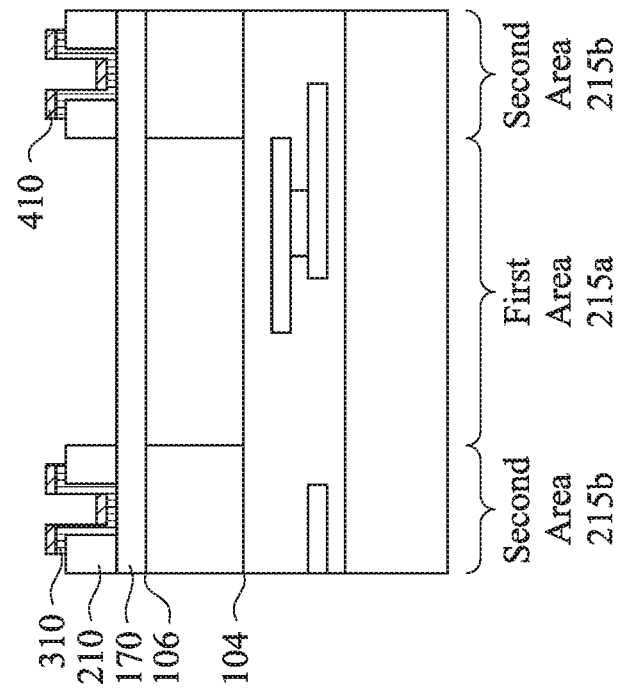
Figure 13A:
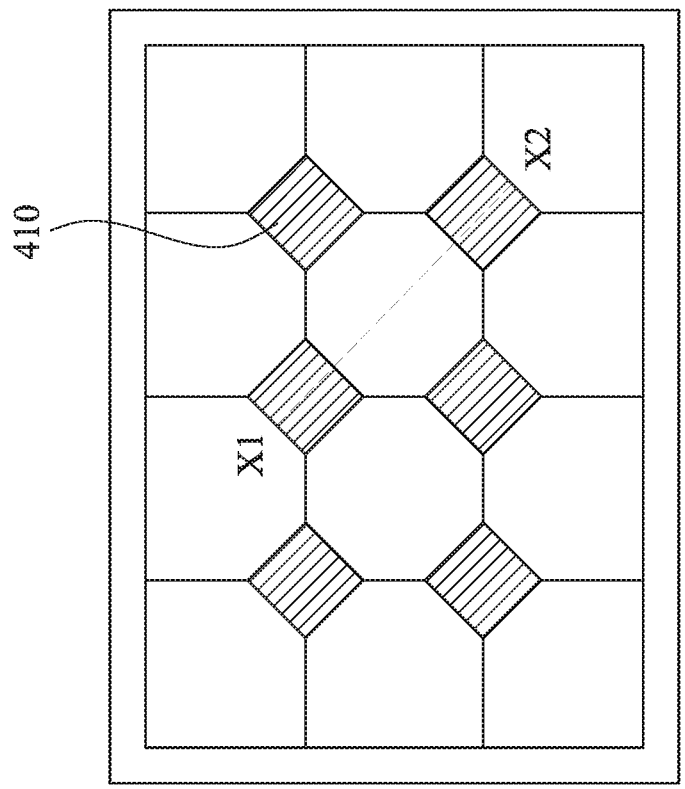

FIGS. 12-13 show exemplary sequential manufacturing process of a semiconductor device according to another embodiment of the present disclosure. FIGS. 12B-13B are cross sectional views corresponding to line X1-X2 of FIG. 12A-13A. It is understood that additional operations can be provided before, during, and after processes shown by FIGS. 12-13, and some of the operations described below can be replaced or eliminated for additional embodiments of the method. The order of the operations/processes may be interchangeable. Further, The same of similar configuration, structure, materials, operations or processes of the foregoing embodiments may be employed in this embodiment and the detailed explanation may be omitted.

In this embodiment, after photoresist layer 510 is patterned and filter layer 410 is etched away from first areas 215a, similar to FIGS. 6A and 6B, remaining sections of photoresist layer 510 may be left on the semiconductor device to protect second areas 215b during an etching of etch-stop layer 310. In this embodiment, to minimize potential quantum efficiency shortcomings caused by etch-stop 310, this layer is selectively removed from first areas 215a.

Etch-stop layer 130 may be etched using a selective etchant. For example, when etch-stop layer 310 is formed with an oxide layer, etch-stop layer 310 may be removed with an etchant process highly selective to oxides, such as CHFx combined with $O_2$ and/or Ar. Because the photoresist is not removed from the semiconductor device, the remaining photoresist layer 510 protects filter layer 410 and etch-stop layer 310 over second areas 215b. Thus, only the etch-stop layer 310 over first areas 215a is etched.

As shown in FIGS. 13A and 13B the remaining photoresist layer 510 that protected layers over second areas 215b may be removed. For example, photoresist layer 510 may be exposed to an organic solvent and/or a photoresist stripper that dissolves and removes remaining portions of photoresist layer 510 from the semiconductor device. Other methods such as dry etching of photoresist may also be used to remove remaining photoresist layer 510.

FIGS. 13A and 13B show the semiconductor device with a grid for the image sensors. The grid formed by gridlines 210 and filter layer 410 may prevent optical cross-talk between sensing regions 114 and enhance quantum efficiency of sensing regions 114. Moreover, etch-stop 310 has been removed from over first areas 215a to minimize quantum efficiency degradation of sensing regions 114.

Figure 14:
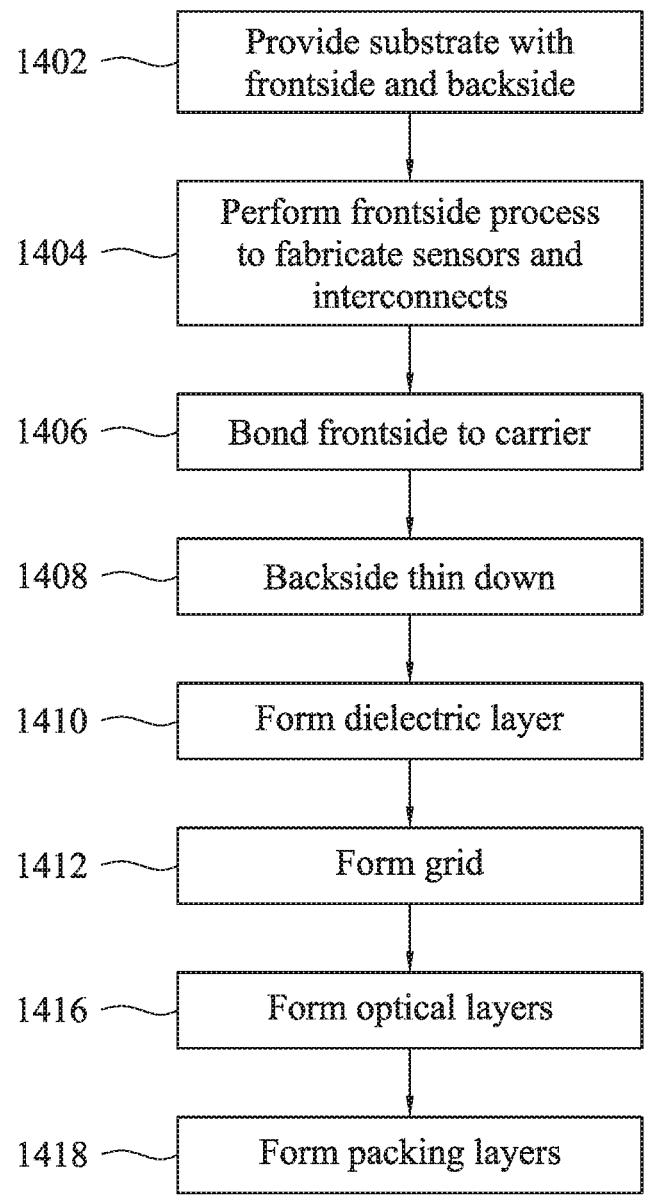
FIG. 14 is an exemplary flow chart representative of a BSI sensor manufacturing process in accordance with embodiments of the present disclosure.

FIG. 14 is an exemplary flow chart representative of a BSI sensor manufacturing process 1400 in accordance with embodiments of the present disclosure. The overall BSI manufacturing process 1400 describes an exemplary method to fabricate a complete BSI sensor.

Process 1400 may initiate with step 1402, in which a substrate that includes a frontside and a back side are provided for manufacturing. For example substrate 102 may be provided in step 1402.

In step 1404, front side processes may be performed on the substrate. For example, sensing regions 114 and MLI 120, including ILD 130, vias 132, and lines 134, may be fabricated on front side 104 of substrate 102.

Process 1400 may continue to step 1406, in which the processed substrate may be bonded to a carrier wafer. For example, substrate 102 may be flipped upside down and MLI 120 may be bonded to carrier wafer 140.

In step 1408, the backside of the substrate may be thinned town so sensors are closer to the top surface of the flipped substrate. For example, when substrate 102 is an SOI substrate, the SOI handle layer may be thinned down in step 1408. However, in step 1408 other types of substrates may be thinned down.

Process 1400 may continue with additional processing on the backside of the substrate. In step 1410, a dielectric layer may be formed on the backside of the substrate. For example, dielectric layer 170 may be formed on backside 106 of substrate 102.

In step 1412, the grid on dielectric layer 170 may be formed to, among other objectives, minimize optical-cross talk and improve quantum efficiency. The grid formed in step 1412 may be formed with methods described in connection with FIGS. 1-13. Alternatively, or additionally, the grid formed in step 1412 may be formed with processes 1500 and 1600, described in connection with FIGS. 15-16. However, alternative methods for the formation of the formed in step 1412 may also be pursued.

In step 1414, optical layers may be formed on the backside of the substrate. For example, optical layers including anti-reflective coatings, color filers, and micro-lenses, may be formed over gridlines 210, areas 215, and/or dielectric layer 170.

Process 1400 may continue to package the BSI sensors in step 1416. For example, in step 1416 a glass wafer may be bonded and grinded to package the BSI sensors.

Figure 15:
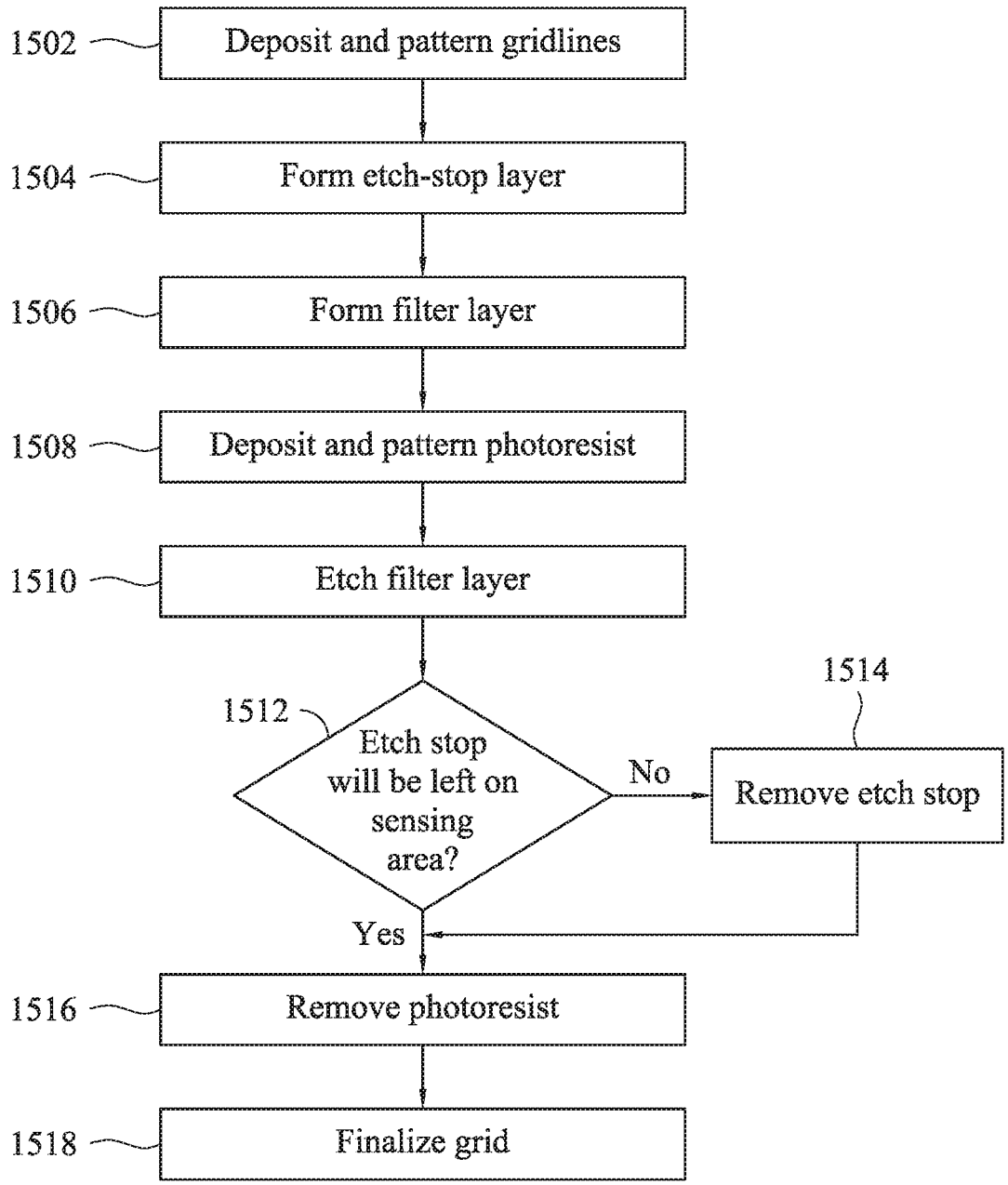
FIG. 15 is an exemplary flow chart representative of a grid manufacturing process in accordance with embodiments of the present disclosure.

FIG. 15 is an exemplary flow chart representative of a grid manufacturing process in accordance with embodiments of the present disclosure. Process 1500 describes in a flow chart process steps to form the grid for BSI sensors described in connection with FIGS. 1-13.

Process 1500 may being with step 1502, in which a grid may be deposited and patterned over dielectric layers on the backside of BSI devices. For example, in step 1502, gridlines 210 may be formed and patterned on dielectric layer 170. Gridlines 210 may define a plurality of areas 215 on dielectric layer 170.

In step 1504, an etch-stop layer may be formed over the backside of BSI devices. For example, etch-stop layer 310 may be conformally formed over backside 106, covering gridlines 210 and exposed portions of dielectric layer 170 in the plurality of areas 215. In step 1506, a filter layer may be formed over the backside of BSI devices. The thickness and material of the filter layer may be selected to have desired optical properties. For example filter layer 410 may be formed over etch-stop layer 310.

In step 1508, photoresist may be deposited and patterned. For example, photoresist layer 510 may be formed and patterned to protect some areas of filter layer 410. In step 1510, exposed areas of filter layer 410, not protected by photoresist, may be etched using an etchant that is selective to filter layer 410. In some embodiments, the etchant used in step 1510 may etch the etch-stop layer of step 1504 at a lower rate than the filter layer.

In step 1512, it may be determined whether it is necessary to remove etch-stop layer from some areas of the BSI device. For example, if the etch-stop has a thickness that may cause light transmission issues or the etch stop does not allow the desired quantum efficiency, it may be determined that the etch-stop layer should be removed (step 1512: no). Process 1500 may continue to step 1514 and exposed regions of the etch-stop layer may be etched from the semiconductor device. For example, etch-stop layer 310 may be removed from the semiconductor device with an RIE etch in regions not protected by photoresist layer 510. Alternatively, it may be determined that the etch-stop layer can remain on the sensing areas (step 1512: yes). When the etch-stop is thin and has a high transmission coefficient, the etch-stop may be left on the sensing areas while not affecting the photo-devices quantum efficiency. For example, if etch-stop layer 310 does not affect the quantum efficiency of sensor elements 414, etch-stop layer 310 may be left remaining on first areas 215*a*. In such embodiments, process 1500 may continue to step 1516 and remove the remainder photoresist. For example, using a photoresist stripper the remaining portions of photoresist layer 510 may be removed.

In step 1518, the grid may be finalized. For example, cleaning and annealing steps to finalize the grid may be performed in step 1518.

Figure 16:
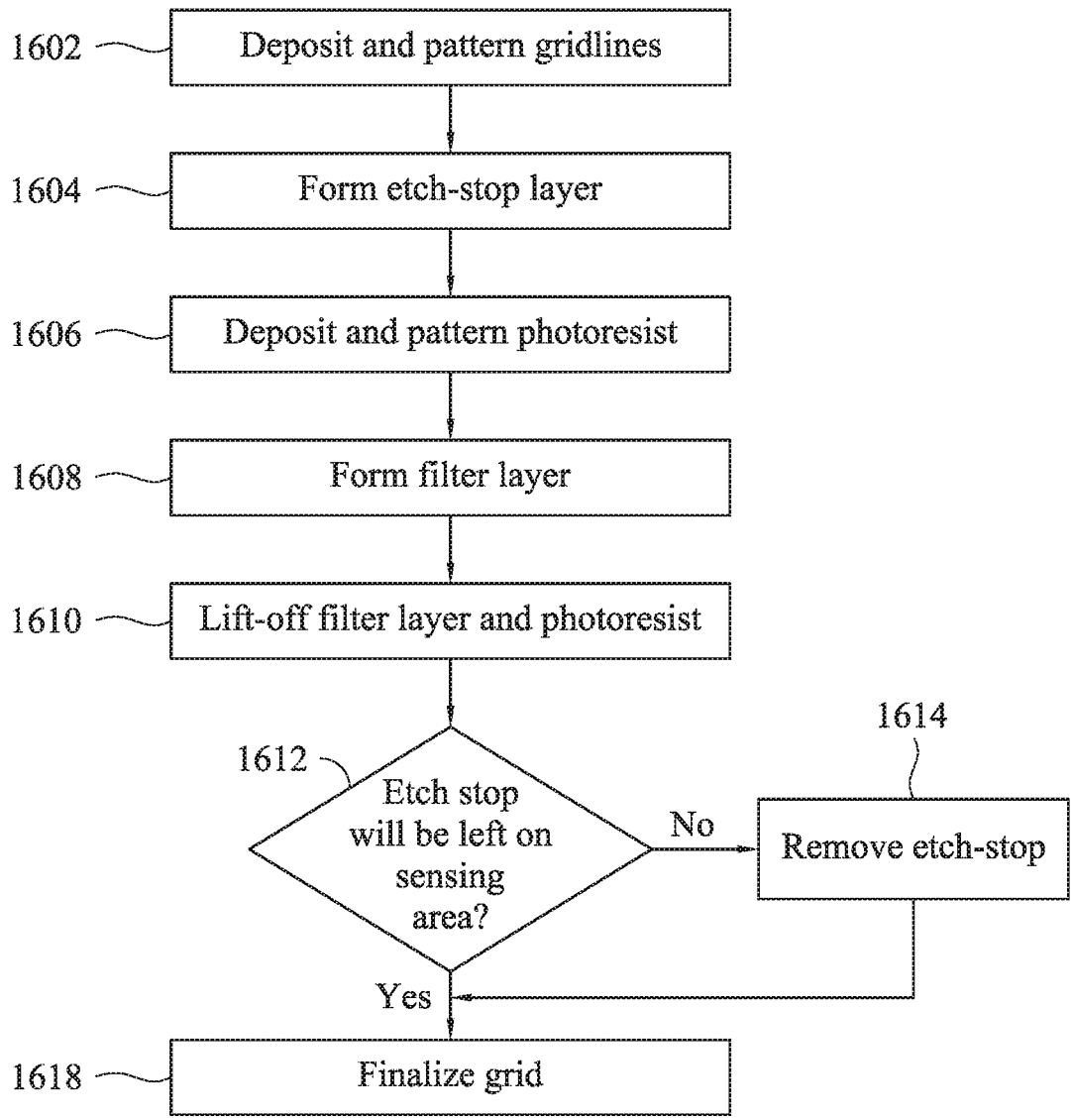
FIG. 16 is an exemplary flow chart representative of a grid manufacturing process in accordance with embodiments of the present disclosure.

FIG. 16 is an exemplary flow chart representative of a grid manufacturing process in accordance with embodiments of the present disclosure. Process 1600 describes in a flow chart process steps to form the grid for BSI sensors described in connection with FIGS. 1-13.

Process 1600 may being with step 1602, in which a grid may be deposited and patterned over dielectric layers on the backside of BSI devices. For example, in step 1602, gridlines 210 may be formed and patterned on dielectric layer 170. In step 1604, an etch-stop layer may be formed over the backside of BSI devices. For example, etch-stop layer 310 may be formed over backside 106 with a non conformal process, covering the top surfaces of gridlines 210 and exposed portions of dielectric layer 170 in the plurality of areas but not covering sidewalls of these layers. In other embodiments, however, the formation of etch-stop layer 310 may be done with a conformal process.

In step 1608, photoresist for a lift-off process may be deposited and patterned. For example, lift-off layer 810, including one or multiple photoresist layers, may be formed and patterned to protect some areas of dielectric layer 170. In step 1510, exposed areas of dielectric layer 170, not protected by lift-off layer 810, may be covered with filter layer 410. In some embodiments, filter layer 410 may be formed with a non conformal process, covering the top surfaces of gridlines 210, lift-off layer 810, and exposed portions of dielectric layer 170 in the plurality of areas but not covering sidewalls of these layers. In other embodiments, however, filter layer 410 may be conformally formed.

In step 1610, a lift-off process may remove the photoresist, clearing any photoresist on the BSI sensors and filter layer 410 on the photoresist. For example, lift-off layer 810 may be removed by exposing it to a photoresist stripper or other solvents. This process may remove not only lift-off layer 810 but also filter layer 410 that is on top of lift-off layer.

In step 1612, like in step 1512 of process 1500, it may be determined whether it is necessary to remove etch-stop layer from some areas of the BSI device. When it is determined that the etch-stop layer should be removed (step 1612: no), process 1600 may continue to step 1614 and exposed regions of the etch-stop layer may be etched from the semiconductor device. However, when it is determined that the etch-stop layer can remain on the sensing areas (step 1512: yes), process 1600 may continue to step 1616 and remove the remainder photoresist. In step 1618, similar to step 1618, the grid may be finalized by, for example, cleaning and annealing steps.

In some situations, BSI sensors may benefit from having grids between light sources and photo-detecting devices to reduce optical cross-talk between adjacent devices and to improve their quantum efficiency. The grids isolate incoming light, can be used to filter out undesired frequencies, and may be configured to reduce or minimize light loss due to scattering or other similar events. Nonetheless, fabrication of gridlines is associated with certain challenges that have the potential for sensor degradation if not considered. For example, imprecise fabrication of gridlines may deteriorate dielectric layers on the sensors, which may affect sensor uniformity and response to incident light. Moreover, if gridlines are not carefully fabricated, gridlines may result with irregular shapes or profiles that, instead of improving the photo-sensing device performance, may diminish device uniformity and efficiency. These among many other challenges of implementing grids on BSI sensors may exist and complicate the overall fabrication of BSI sensors with grids.

The present disclosure provides for many different embodiments to form a grid for BSI sensors with little or no damage to other layers caused by etching steps during the grid fabrication. The disclosed etch-stop layer for the fabrication of the grid may facilitate the grid fabrication and improve device performance. For example, including etch-stop layer 310 allows over-etching filter layer 410 from certain regions with little risk of damage to gridlines 210 and/or dielectric layer 170. Undesired etching may affect yield and performance of the sensors. Therefore, fabrication errors associated with inaccurate etching may be avoided by introducing an etch-stop in the fabrication of the grid. Moreover, selecting etch-stop layer 310 with high transmittance and high etch selectivity, when compared with other layers of BSI sensors, allows the creation of flicker reduction layers with no quantum efficiency reduction of finalized devices. Further, the disclosed embodiments do not require additional masking steps because the etch-stop may be formed over the entire substrate avoiding additional lithography processes. For example, etch-stop layer 310 may be conformably deposited over the entire substrate 102 and not require additional masks. Thus, the introduction of etch-stop layer 310 does not significantly increase manufacturing costs or complexity. For at least these reasons, the advantages of the disclosed embodiments may result in more accurate and simpler processes for BSI fabrication that improve both reliability and yield of BSI devices.

It will be understood that not all advantages have been necessarily discussed herein, no particular advantage is required for all embodiments or examples, and other embodiments or examples may offer different advantages.

According to one aspect of the present disclosure, in method for forming a semiconductor device, photo-sensing regions are formed over a frontside of a substrate. A first layer is formed over a backside of the substrate and patterned to form a plurality of grid lines defining a plurality of first areas and a plurality of second areas. A second layer is formed over exposed portions of the backside, the gridlines, the first areas, and the second areas, and a third layer is formed over the second layer. The third layer is patterned so as to remove the third layer from over the plurality of first areas.

According to another aspect of the present disclosure, in a method for forming a semiconductor device sensing regions are formed over a frontside of a substrate. An insulating layer is formed over a backside of the substrate and a conductive grid is patterned over the insulating layer. The conductive grid defines first areas and second areas, each of the first areas at least partially overlapping with corresponding sensing regions on the frontside of the substrate. An etch-stop layer is formed over the insulating layer and the conductive grid and a filter layer is formed over the etch-stop layer. The filter layer is removed from over the first areas and optical layers get formed over the backside.

In accordance with yet another aspect of the present disclosure, a device includes a semiconductor substrate comprising a frontside and a backside. The device also includes a plurality of sensing regions disposed over the frontside of the substrate, a first layer disposed over the backside of the substrate, having a thickness between 10 and 10000 Å, and a plurality of conductive gridlines formed over the first layer. The plurality of conductive gridlines define a plurality of first areas and a plurality of second areas, and each one of the plurality of first areas at least partially overlap with a corresponding sensing region. The device also includes a second layer, having a thickness between 10 and 5000 Å, disposed over the plurality of second areas and at least a portion of the plurality of gridlines, and a third layer, a thickness between 10 and 1000 Å, disposed over the second layer. The third layer is electrically conductive and comprises at least one of a nitride layer or a metal layer and partially absorbs radiation having wavelengths between 10 and 1000 nm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, while illustrative embodiments have been described herein, the scope thereof includes any and all embodiments having equivalent elements, modifications, omissions, combinations (e.g., of aspects across various embodiments), adaptations and/or alterations as would be appreciated by those in the art based on the present disclosure. For example, the number and orientation of components shown in the exemplary systems may be modified. Further, with respect to the exemplary methods illustrated in the attached drawings, the order and sequence of steps may be modified, and steps may be added or deleted.

Thus, the foregoing description has been presented for purposes of illustration only. It is not exhaustive and is not limiting to the precise forms or embodiments disclosed. Modifications and adaptations will be apparent to those skilled in the art from consideration of the specification and practice of the disclosed embodiments.

The claims are to be interpreted broadly based on the language employed in the claims and not limited to examples described in the present specification, which examples are to be construed as non-exclusive. Further, the steps of the disclosed methods may be modified in any manner, including by reordering steps and/or inserting or deleting steps.

What is claimed is:

1. A method for forming a semiconductor device, comprising:
    forming photo-sensing regions over a frontside of a substrate;
    patterning a first layer over a backside of the substrate to form a plurality of gridlines defining a plurality of first areas and a plurality of second areas, wherein each one of the plurality of first areas at least partially overlaps with corresponding photo-sensing regions on the frontside of the substrate, and wherein each one of the plurality of second areas does not overlap with corresponding photo-sensing regions on the frontside of the substrate;
    forming a second layer over exposed portions of the backside, the plurality of gridlines, the plurality of first areas, and the plurality of second areas;
    forming a third layer over the second layer; and
    patterning the third layer so as to remove the third layer from over the plurality of first areas while leaving portions of the third layer over the plurality of second areas and at least a portion of the plurality of gridlines.

2. The method of claim 1 wherein patterning the third layer comprises:

forming a fourth layer over the third layer;
patterning the fourth layer so as to remove the fourth layer from over the plurality of first areas;
etching exposed regions of the third layer using an etchant; and
removing remaining portions of the fourth layer from the backside.

3. The method of claim 2, wherein patterning the fourth layer comprises:
removing the fourth layer from over at least a portion of each of the plurality of gridlines.

4. The method of claim 3, wherein
a width of each of the plurality of gridlines defining the plurality of second areas is greater than a width of each of the plurality of gridlines defining the plurality of first areas; and
removing the fourth layer comprises removing the fourth layer from over at least half the width of each of the plurality of gridlines.

5. The method of claim 4, wherein removing the fourth layer comprises completely removing the fourth layer from over each of the plurality of gridlines.

6. The method of claim 2, wherein
the etchant etches the third layer at a faster rate than the etchant etches the second layer; and
the etchant etches the third layer at a faster rate than the etchant etches the first layer.

7. The method of claim 6, wherein
the etchant etches the third layer at a rate at least three times faster than the etchant etches the first layer; and
the etchant etches the first layer at a rate at least twelve times faster than the etchant etches the second layer.

8. The method of claim 2, wherein etching exposed regions of the third layer comprises exposing portions of the third layer to a fluorine gas.

9. The method of claim 2, wherein
the etchant is a first etchant; and
the method further comprises removing the second layer from the plurality of first areas by etching exposed regions of the second layer using a second etchant after patterning the third layer, the second etchant being different from the first etchant, the second etchant being selective to the second layer.

10. The method of claim 2, wherein
forming the fourth layer comprises depositing a photoresist layer with a thickness of at least two times a thickness of the first layer.

11. The method of claim 10, wherein
depositing the photoresist layer comprises spin-coating photoresist to a thickness of between 5000 and 15000 Å.

12. The method of claim 1, wherein
the second layer is thinner than the third layer; and
the second layer is more transmissive to light than the third layer.

13. The method of claim 12, wherein the third layer at least partially filters radiation having a wavelength between 10 nm and 1000 nm.

14. The method of claim 1, wherein
each of the plurality of first areas is shaped as a first polygon, the sides of the first polygon being defined by the plurality of gridlines, the first polygon having more than four sides;
each of the plurality of second areas is shaped as a second polygon, the sides of the second polygon being defined by the plurality of gridlines, the second polygon having fewer sides than the first polygon;
at least one of the plurality of first areas is directly adjacent to at least four of the plurality of second areas, each of the at least four of the plurality of second areas sharing a gridline with distinct sides of the at least one of the plurality of first areas; and
the at least one of the plurality of first areas is larger than each of the at least four of the plurality of second areas.

15. The method of claim 1 wherein,
patterning the first layer comprises forming a reflective layer comprising at least one of tungsten, cobalt, titanium, aluminum, copper, or aluminum copper, the reflective layer having a thickness between 100 and 10000 Å;
forming the second layer comprises forming an insulating layer comprising at least one of silicon oxide, silicon carbide, silicon nitride, or silicon oxynitride, the insulating layer having a thickness between 10 and 10000 Å; and
forming the third layer comprises forming a filter layer comprising at least one of a nitride layer or a metal layer, the filter layer having a thickness between 100 and 10000 Å.

16. The method of claim 15, wherein
forming the reflective layer comprises forming a tungsten layer having a thickness between 1000 and 5000 Å;
forming the insulating layer comprises forming an oxide layer having a thickness between 200 and 700 Å; and
forming the filter layer comprises forming a titanium nitride layer having a thickness between 700 and 1100 Å.

17. The method of claim 1, wherein
forming the second layer comprises forming a conformal oxide layer having a thickness between 10 and 5000 Å; and
forming the third layer comprises forming a conformal nitride layer.

18. A method for forming a semiconductor device comprising:
forming sensing regions over a frontside of a substrate;
forming an insulating layer over a backside of the substrate;
patterning a light reflective grid over the insulating layer, the light reflective grid defining first areas and second areas, each of the first areas at least partially overlapping with corresponding sensing regions on the frontside of the substrate, each of the second areas not overlapping with corresponding sensing regions on the frontside of the substrate;
forming an etch-stop layer over the insulating layer and the light reflective grid;
forming a filter layer over the etch-stop layer;
removing the filter layer from over the first areas while leaving portions of the filter layer over the second areas and at least a portion of the light reflective grid; and
forming optical layers over the backside.

19. A device comprising:
a semiconductor substrate comprising a frontside and a backside;
a plurality of sensing regions disposed over the frontside of the substrate;
a first layer disposed over the backside of the substrate, the first layer being an insulating layer having a thickness between 10 and 10000 Å;
a plurality of light reflective gridlines formed over the first layer, the plurality of light reflective gridlines defining a plurality of first areas and a plurality of second areas, each one of the plurality of first areas at least partially overlapping with a corresponding sensing region, each of the second areas not overlapping with corresponding sensing regions on the frontside of the substrate;

a second layer disposed over the plurality of second areas and at least a portion of the plurality of gridlines, wherein the second layer is an insulating layer having a thickness between 10 and 5000 Å; and a third layer disposed over the second layer, the third layer being disposed over the plurality of second areas without covering the plurality of first areas, the third layer being disposed over at least a portion of the gridlines, wherein the third layer is electrically conductive and comprises at least one of a nitride layer or a metal layer, wherein the third layer has a thickness between 10 and 1000 Å, and wherein the third layer at least partially absorbs radiation having wavelengths between 10 and 1000 nm.

20. The device of claim 19, wherein each one of the plurality of second areas is directly adjacent to at least two of the plurality of first areas;

the second layer is also disposed over the first areas; and a thickness of the second layer disposed over the first areas is less than a thickness of the second layer disposed over the second areas.

* * * * *